United States Patent
Keehn et al.

(10) Patent No.: US 12,363,863 B2
(45) Date of Patent: Jul. 15, 2025

(54) TWO PHASE COOLANT MANAGEMENT

(71) Applicant: Microsoft Technology Licensing, LLC, Redmond, WA (US)

(72) Inventors: Nicholas Andrew Keehn, Kirkland, WA (US); Bharath Ramakrishnan, Bellevue, WA (US); Eric Clarence Peterson, Woodinville, WA (US); Husam Alissa, Redmond, WA (US); Seth Henderson Morris, Advance, NC (US); Ioannis Manousakis, New York, NY (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/630,690

(22) Filed: Apr. 9, 2024

(65) Prior Publication Data
US 2024/0260232 A1    Aug. 1, 2024

Related U.S. Application Data

(62) Division of application No. 17/565,242, filed on Dec. 29, 2021, now Pat. No. 11,991,858.

(60) Provisional application No. 63/150,505, filed on Feb. 17, 2021.

(51) Int. Cl.
H05K 7/20    (2006.01)

(52) U.S. Cl.
CPC ......... H05K 7/203 (2013.01); H05K 7/20318 (2013.01); H05K 7/20327 (2013.01)

(58) Field of Classification Search
CPC ............ F28D 15/0266; F28D 15/0258; F28D 15/025; H05K 7/203; H05K 7/20318; H05K 7/20327; H05K 7/20272; H05K 7/2029; H05K 7/208; H05K 7/20936; F25B 43/04; F25B 2345/002; H01L 23/44; H01L 23/46; H01L 23/473; H01L 21/67184; G06F 1/20
USPC ........................................................ 361/699
See application file for complete search history.

(56) References Cited

U.S. PATENT DOCUMENTS

2007/0193285 A1*  8/2007  Knight .................. G01M 3/228
                                                                     62/149

* cited by examiner

*Primary Examiner* — Mandeep S Buttar
(74) *Attorney, Agent, or Firm* — Rainier Patents, P.S.

(57) ABSTRACT

The discussion relates to cooling computing devices and specifically to managing two-phase cooling. One example can include a two-phase liquid immersion tank containing heat generating components and a liquid phase of a coolant having a boiling point within an operating temperature range of the heat generating components. The example can also include a stratification chamber fluidly coupled to the liquid immersion tank and configured to at least partially separate a gas phase of the coolant from other gases. The example can further include a condenser chamber fluidly coupled to the stratification chamber and configured to receive the gas phase of the coolant and cause the gas phase of the coolant to phase change back into the liquid phase of the coolant.

20 Claims, 14 Drawing Sheets

TWO PHASE COOLANT MANAGEMENT

BACKGROUND

Two-phase cooling has been contemplated for various computing devices. However, fluids having suitable properties, such as electrically insulative, non-corrosive, and/or suitable boiling points were unavailable. Relatively recently, suitable fluids have been discovered. These fluids tend to be biologically harmful, such as to organisms that inhale them and/or they act as greenhouse gases. Existing techniques that use these fluids tend to lose relatively high amounts of these fluids to the environment where they can harm workers and contribute to global warming. The present concepts can address these and/or other issues.

BRIEF DESCRIPTION OF THE DRAWINGS

The accompanying drawings illustrate implementations of the concepts conveyed in the present patent. Features of the illustrated implementations can be more readily understood by reference to the following description taken in conjunction with the accompanying drawings. Like reference numbers in the various drawings are used wherever feasible to indicate like elements. In some cases, parenthetical suffixes or alphabetic suffixes are utilized after a reference number to distinguish like elements. Use of the reference number without the associated suffix is generic to the element. Further, the left-most numeral of each reference number conveys the figure and associated discussion where the reference number is first introduced.

DETAILED DESCRIPTION

Figure 1A:
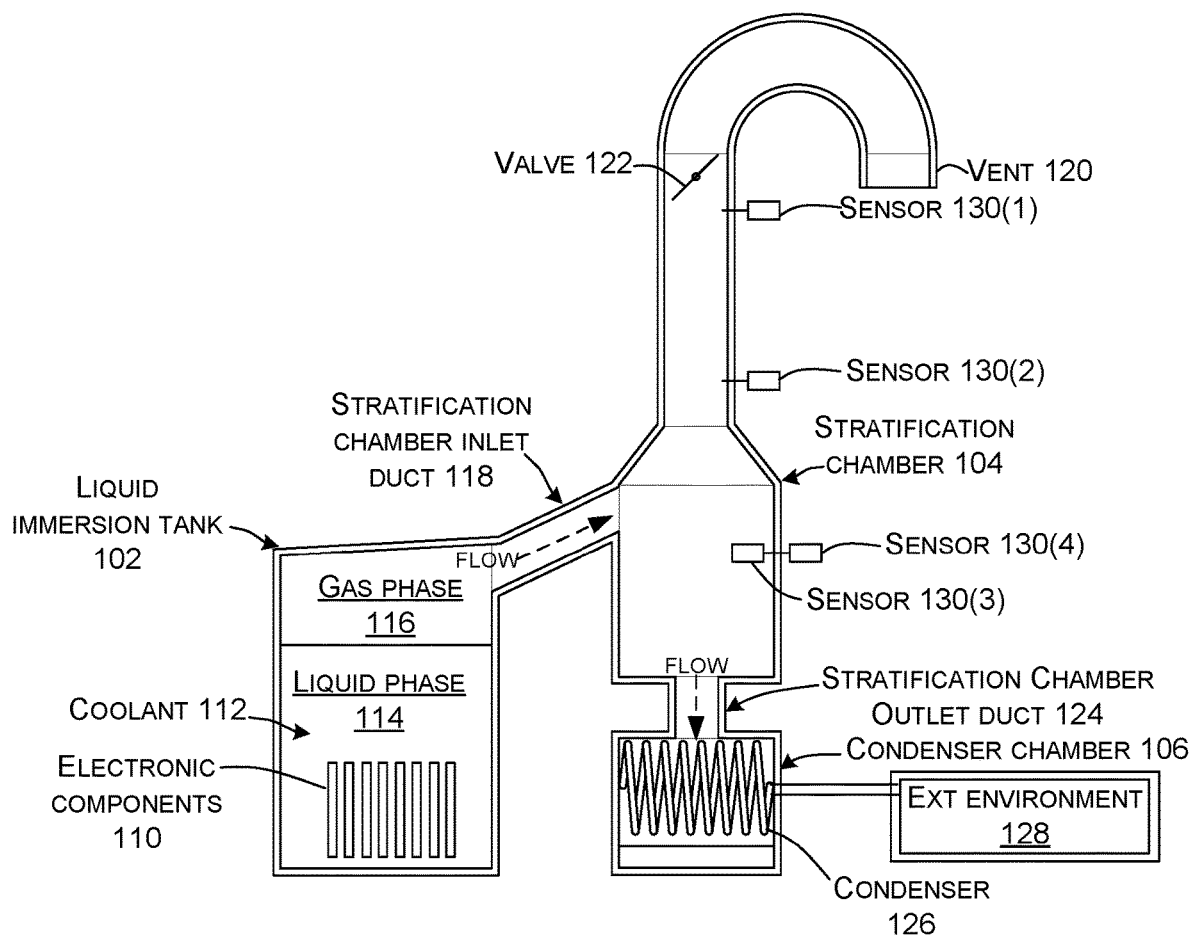
FIGS. 1A-1H, 2A, 2C, 3A, 4, and 5 show elevational views of example two-phase coolant systems in accordance with some implementations of the present concepts.

The present concepts relate to two-phase liquid cooling of electronic devices, such as processors and other computing components. Two-phase cooling can remove large amounts of heat per volume of space and thus can allow high component density and performance without overheating. Heat from the components can boil liquid phase coolant into gas phase coolant (hence the term 'two-phase cooling'). The gas phase coolant can carry the heat from the components to a different area of the cooling system where the heat can be transferred to an external cooling system. As a result of the energy transfer, the gas phase coolant returns to the liquid phase. The liquid phase coolant can be recycled to start the cooling process again for the components. However, two-phase cooling can involve cooling fluids (e.g., coolants) that are hazardous to users and/or bad for the environment. As such, it is desired to maintain the coolants in the cooling system. Further, other gases, such as air can enter the cooling system. These other gases can interfere with the heat transfer process, such as from the gas phase coolant to the external cooling system. The present concepts can address both of these issues by removing the other gases from the cooling system without releasing coolant. These and other aspects are described in more detail below.

FIGS. 1A-1H collectively show an example cooling system (e.g., system) 100A. In this case, the system includes a two-phase liquid immersion tank 102, a stratification chamber 104, and a condenser chamber 106.

The two-phase liquid immersion tank 102 can include electronic components 110 positioned in a coolant 112, specifically a liquid phase coolant 114 (e.g., liquid phase). Electronic components 110 generate heat during operation. Managing the heat is paramount to the performance and service life of the electronic components 110. The coolant 112 can dissipate heat from the electronic components 110. The liquid phase coolant 114 can have a boiling point into a gas phase coolant 116 (e.g., gas phase) selected for properties of the respective electronic components 110. For instance, coolant 112 can be selected to have a boiling point from liquid phase 114 to gas phase 116 within an operational temperature range of the electronic components 110. For example, the boiling point can be below a specified or designed maximum operating temperature of the electronic components.

Normal operation of the electronic components 110 will cause the liquid phase 114 proximate to the electronic components to boil (e.g., change phase from the liquid phase 114 to the gas phase 116). Thus, the liquid immersion tank 102 can function as a two-phase cooling system. Further, the phase change from liquid to gas involves thermal movement of heat away from the heat generating electronic components 110 as the gas rises through the liquid and away from the electronic components. Thus, the present concepts can leverage thermal movement associated with boiling rather than relying solely on input energy to actively move heat in the system. As such, the two-phase liquid immersion tank can also be referred to as a 'boiler.'

Various coolants 112 have suitable properties for use in the two-phase liquid immersion tank 102. Suitable coolants 112 tend to be electrically insulative and non-corrosive. However, various coatings or treatments may be applied to the electronic components 110 to mediate corrosion issues. Fluorochemicals provide an example class of coolants 112 that can possess these properties, such as being electrically insulative, non-corrosive, and having suitable boiling points. Commercially available example Fluorochemicals include the Novec brand engineered fluids offered by 3M Corp, among others.

The system 100A can be designed, sized, and/or managed to promote relatively laminar movement of gases within the system. For instance, laminar flow can be promoted by relatively slow gas movement.

In this implementation, the two-phase liquid immersion tank 102 can be fluidly coupled to the stratification chamber 104, such as by a stratification chamber inlet duct 118. The stratification chamber inlet duct 118 can be sized to allow a designed volume of gas phase coolant to move from the two-phase liquid immersion tank 102 to the stratification chamber 104 at relatively low velocities to contribute to a relatively laminar flow of the gas phase coolant and/or other gases. The stratification chamber inlet duct 118 and/or other structures can be shaped with generally planar surfaces and/or smooth transitions to reduce turbulence of the gases. The stratification chamber 104 can be vertically elongated (e.g., a vertically elongated stratification chamber) and have a vent 120 at the upper extreme. A valve 122 can control gas flow to the vent 120. A lower end of the stratification chamber 104 can be fluidly coupled to the condenser chamber 106, such as by a stratification chamber outlet duct 124.

The condenser chamber 106 can include a condenser 126 that carries heat out of the system to an external environment 128. In this illustration, the condenser represents part of a vapor compression cycle that moves heat energy from the condenser chamber 106 to the external environment 128. In the condenser chamber 106 the condenser 126 can be relatively cool. Gas phase coolant 116 can contact the condenser 126, cool and phase change (e.g., condense) back into the liquid phase 114. The liquid phase 114 can be returned to the liquid immersion tank 102.

Various sensors 130 can be positioned in and/or around the liquid immersion tank 102, the stratification chamber 104, and/or the condenser chamber 106. In this example, sensors 130(1) and 130(2) are vertically arranged in the stratification chamber 104. Sensor 130(3) is positioned in the stratification chamber 104 and sensor 130(4) can be a similar sensor positioned outside the stratification chamber 104 to sense ambient conditions.

As designed, the coolant 112 can boil and carry heat energy away from the electronic components 110 in the gas phase coolant 116. The gas phase coolant 116 can transfer this energy to the condenser 126 and condense back to the liquid phase coolant 114. The condenser 126 can carry the heat out of the system 100A. However, if other gases (132, FIG. 1B) such as air enter the system, they tend to interfere with the condenser and the system does not function as designed (e.g., is less efficient). The present concepts address these concerns and can evacuate the other gases 132 from the system 100 while retaining the coolant 112. This allows the present implementations to operate more efficiently than traditional two-phase liquid immersion systems. These aspects are explained by way of example relative to FIGS. 1B-1H.

Figure 1B:
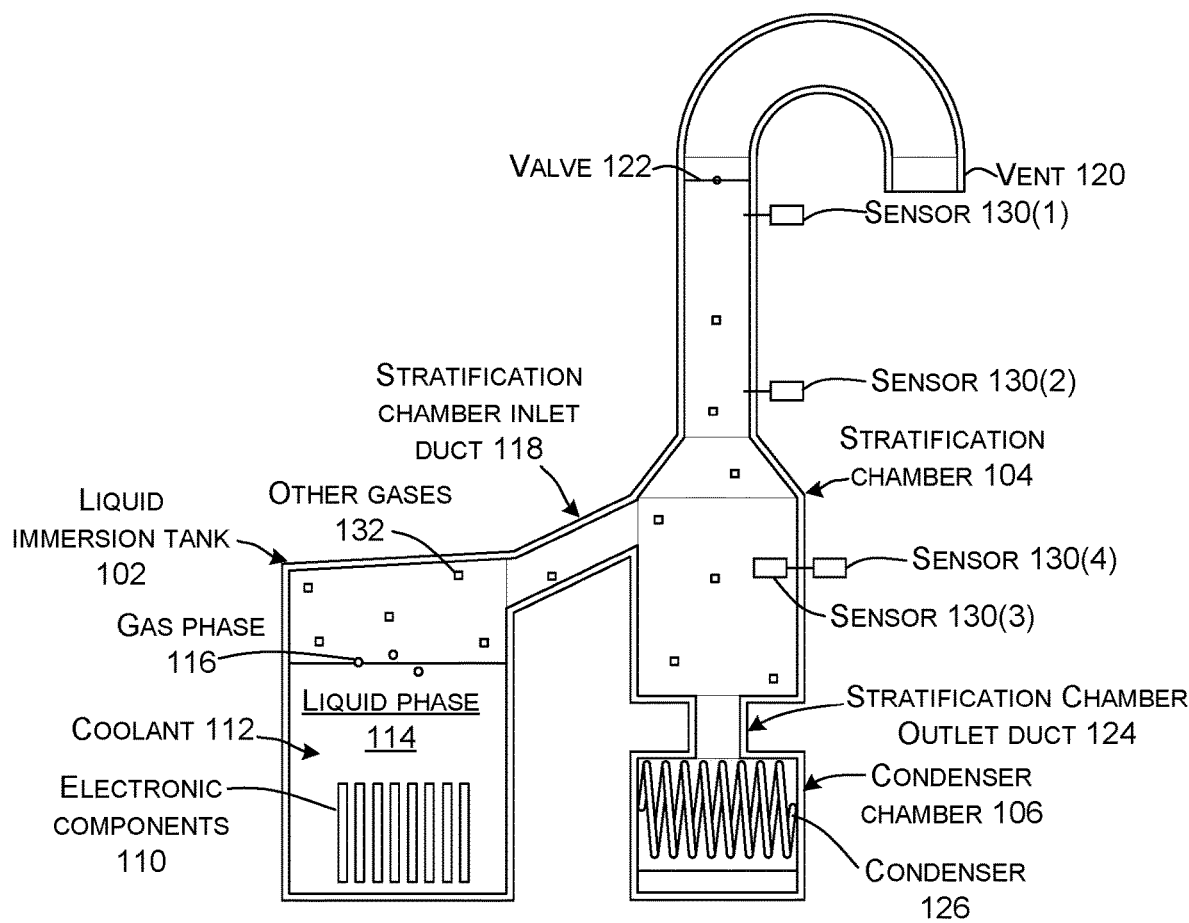

FIG. 1B shows a condition of the system 100A at initial start-up or after the two-phase liquid immersion tank 102 has been opened for maintenance. Other gases 132, such as air, are present in the system and are represented as multiple "◻" in FIG. 1B. These other gases tend to have a much lower density than the gas phase coolant 116, which is represented as multiple "o" in FIG. 1B. The present concepts can leverage this density difference to isolate the other gases 132 and facilitate their removal from the system.

At the point illustrated in FIG. 1B, electronic components 110 can be operated to generate heat that boils some of the liquid phase 114 of coolant 112 to form gas phase 116. Also, valve 122 can be closed to prevent gas phase coolant 116 from exiting the system 100A. The condenser 126 can be operated at a reduced level to allow concentrations of gas phase coolant 116 to rise in the system. In this example, these procedures can be implemented automatically when the system is closed and sealed. In other implementations, the procedures could be implemented based upon information from the sensors 130.

Figure 1C:
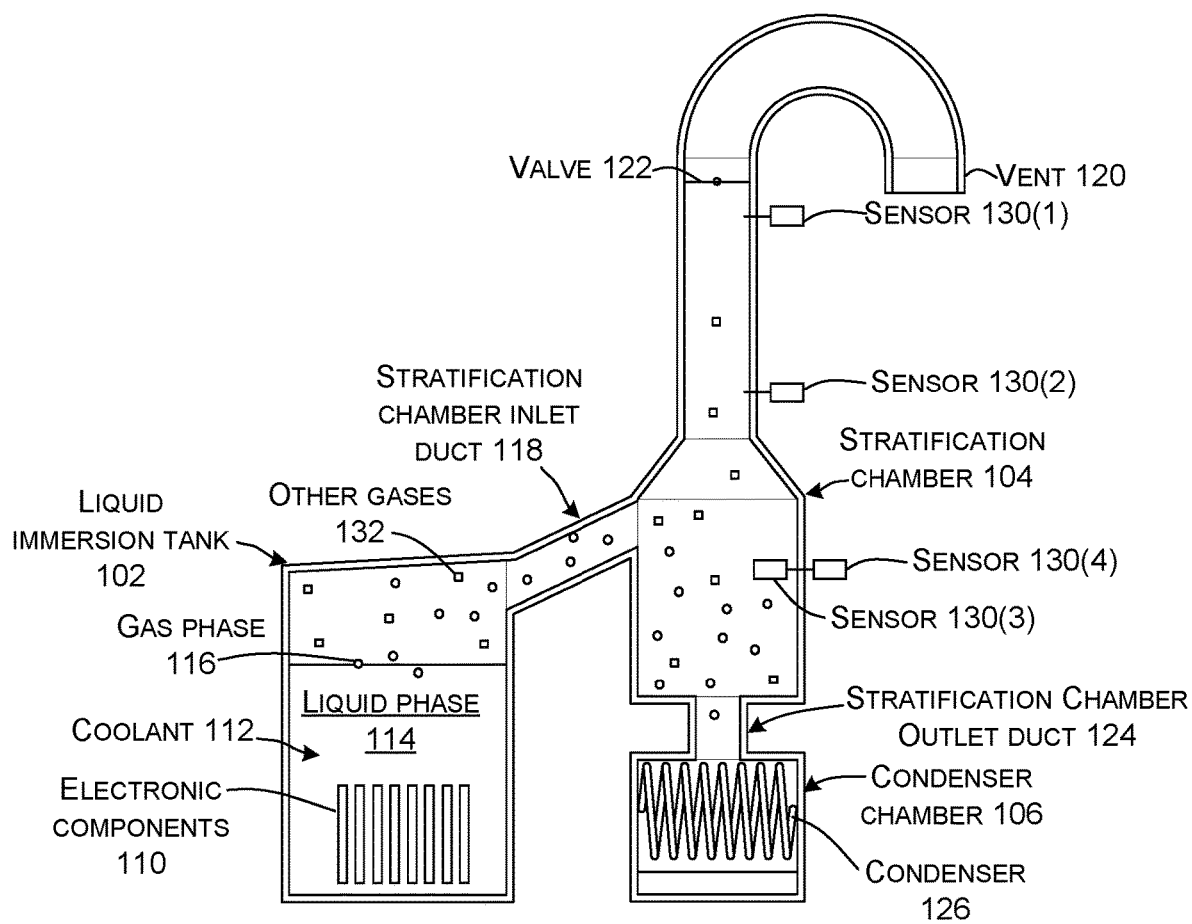

FIG. 1C shows increasing amounts of gas phase coolant 116 in the two-phase liquid immersion tank 102 and the stratification chamber inlet duct 118 caused by the electronic components 110 boiling liquid phase coolant 114 into gas phase coolant 116. The condenser 126 can be operated at a reduced rate compared to a normal mapping to the amount of heat being generated by the electronic components 110. This reduced condenser operation can allow a small buildup of gas phase coolant 116 and reduce gas movement associated with condensing gas phase coolant 116 back into liquid phase coolant 114. Stated another way, the coolant cycle from liquid to gas and back to liquid tends to create gas movement and temporarily decreasing or stopping the gas to liquid phase change tends to decrease this gas movement. This gas movement can cause 'mixing' of the gas phase coolant 116 and the other gases 132 and thus slowing the gas movement can decrease mixing.

At this point, the gas phase coolant 116 is beginning to settle lower in the stratification chamber 104 while the other gases 132 are rising in the stratification chamber (e.g., the gas phase coolant 116 is starting to stratify below the other gases 132 due to its higher density).

Figure 1D:
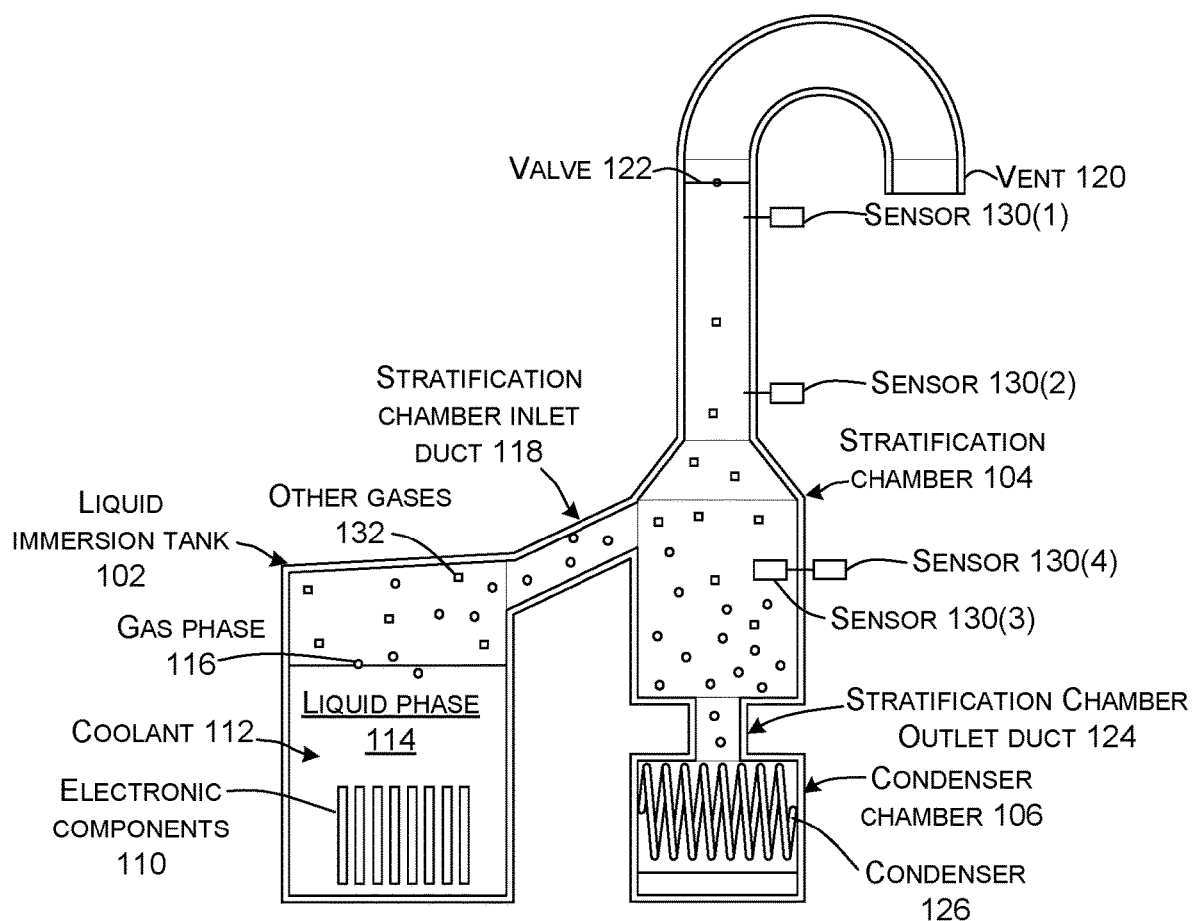

FIG. 1D shows additional gas phase coolant 116 in the system 100A. The gas phase coolant continues to move slowly into the stratification chamber 104 and move downwardly (due to higher density) while the other gases 132 continue to move upwardly (due to lower density) (e.g., the stratification is continuing).

Figure 1E:
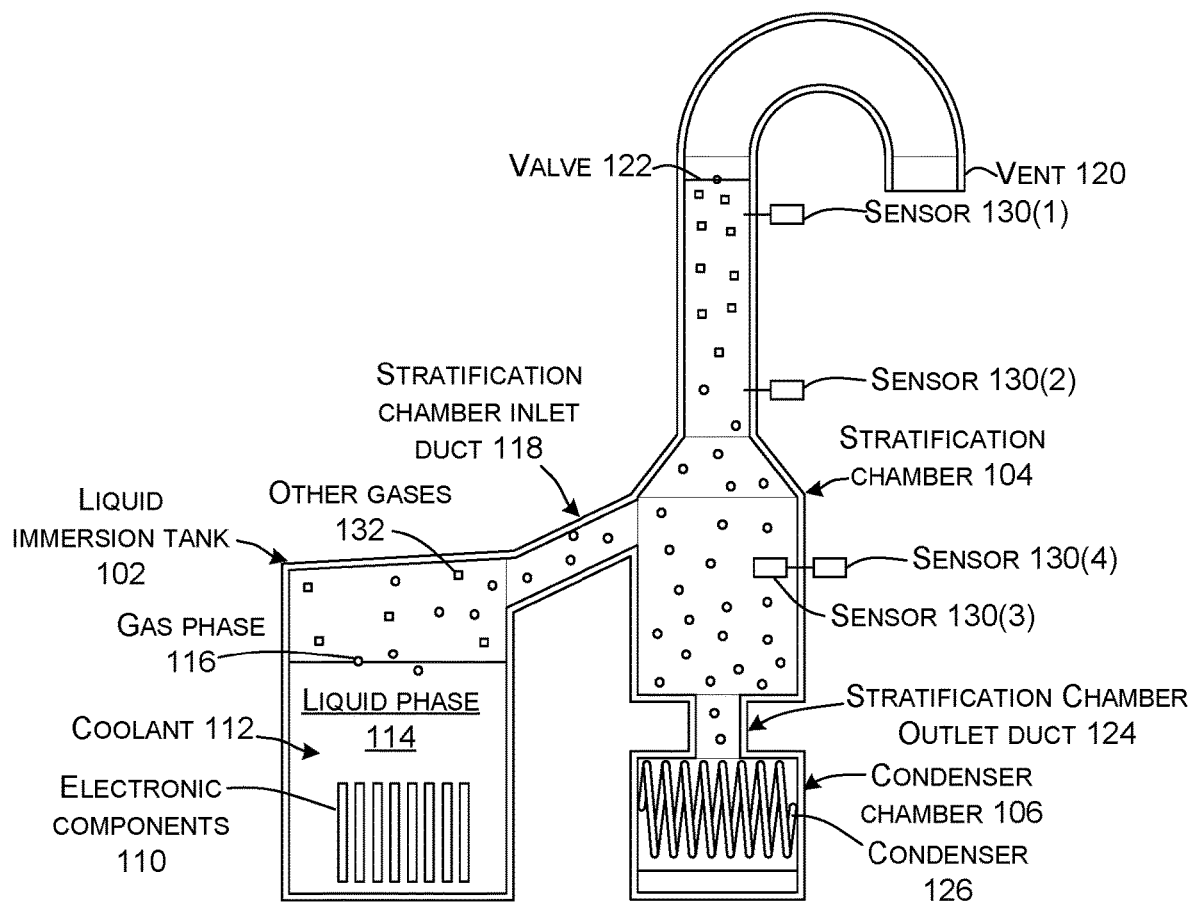

FIG. 1E shows a subsequent point where the stratification is generally complete and the gas phase coolant 116 occupies the lower region of the stratification chamber 104, the stratification chamber outlet duct 124, and the condenser chamber 106, while the other gases 132 have risen to the upper regions (e.g., top) of the stratification chamber 104. This stratification can be sensed by sensors 130(1) and 130(2). Sensor 130(1) is positioned in the upper region of the stratification chamber 104 and the lower density other gases 132 can rise into the upper region and be sensed in higher concentrations than in lower regions of the stratification chamber 104. Sensor 130(2) is positioned relatively high in the stratification chamber, but lower than sensor 130(1). As such, sensor 130(2) should sense higher concentrations of gas phase coolant 116 and lower concentrations of other gases 132 compared to sensor 130(1). Various sensor types that can distinguish the two environments (e.g., sense one or both of the gas phase coolant and the other gases) are described below relative to FIG. 4.

Figure 1F:
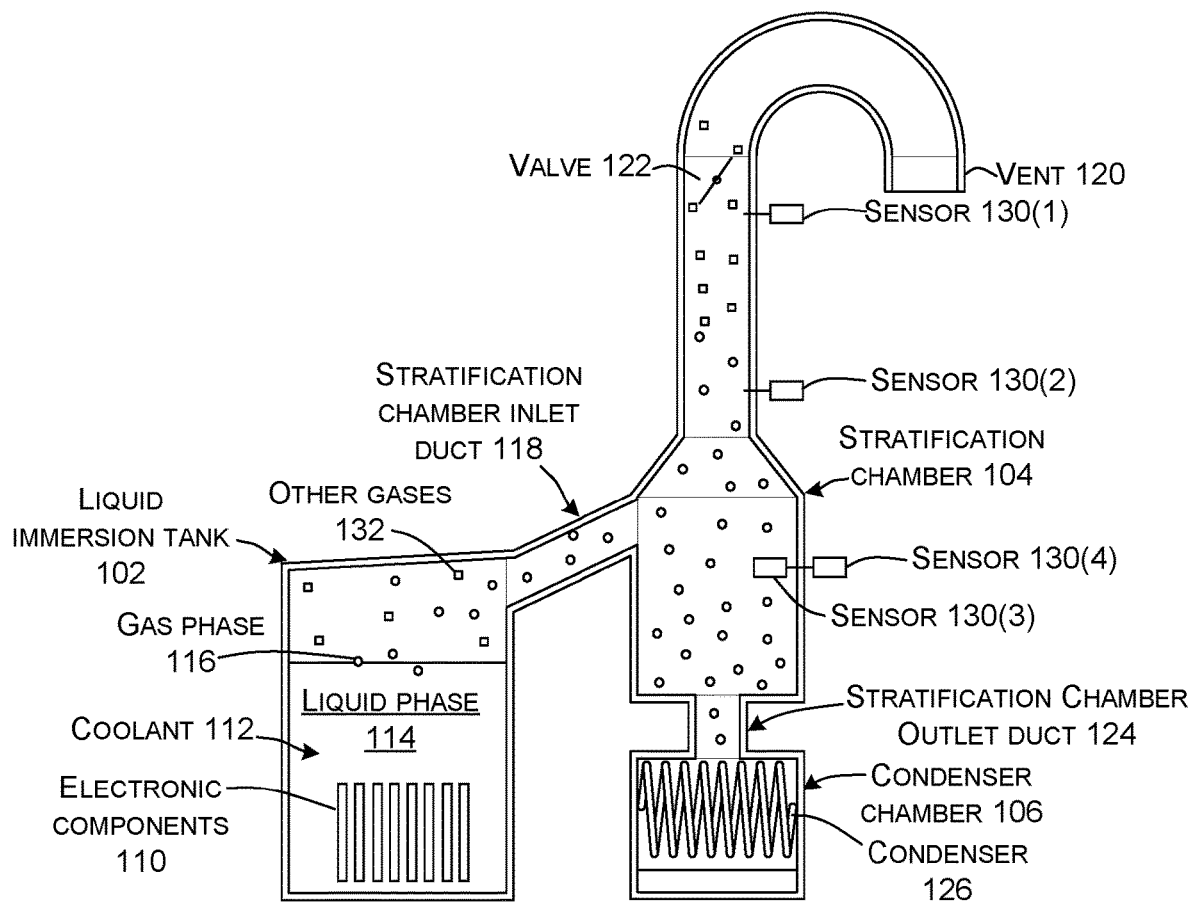
Figure 1G:
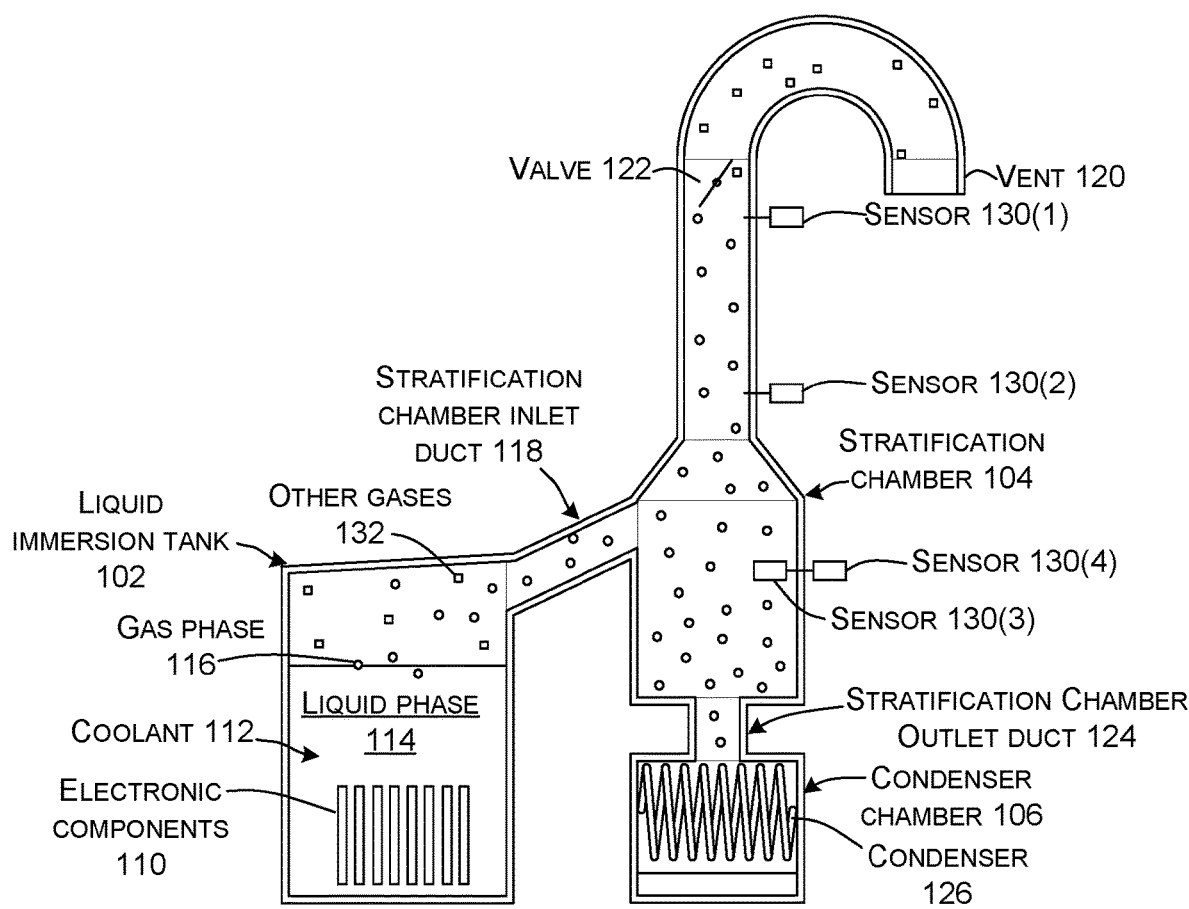

FIG. 1F shows the valve 122 open to allow the other gases 132 to evacuate out the vent 120 of the stratification chamber 104. In this implementation, the valve 122 and the sensor 130(1) are positioned in the uppermost region of the stratification chamber 104 to allow sensing and evacuation of the relatively low-density other gases 132 that rise to the top of the stratification chamber 104. In some implementations, the electronic components 110 can be powered on (or higher) during valve opening to create a positive pressure in the system 100A to help force the other gases 132 out of the vent 120. The vent 120 can be closed based upon various criteria. For instance, the vent 120 can be closed when sensor 130(1) starts to produce similar data as sensor 130(2) (e.g., is sensing gas phase coolant 116 rather than other gases 132). This condition is shown in FIG. 1G.

Figure 1H:
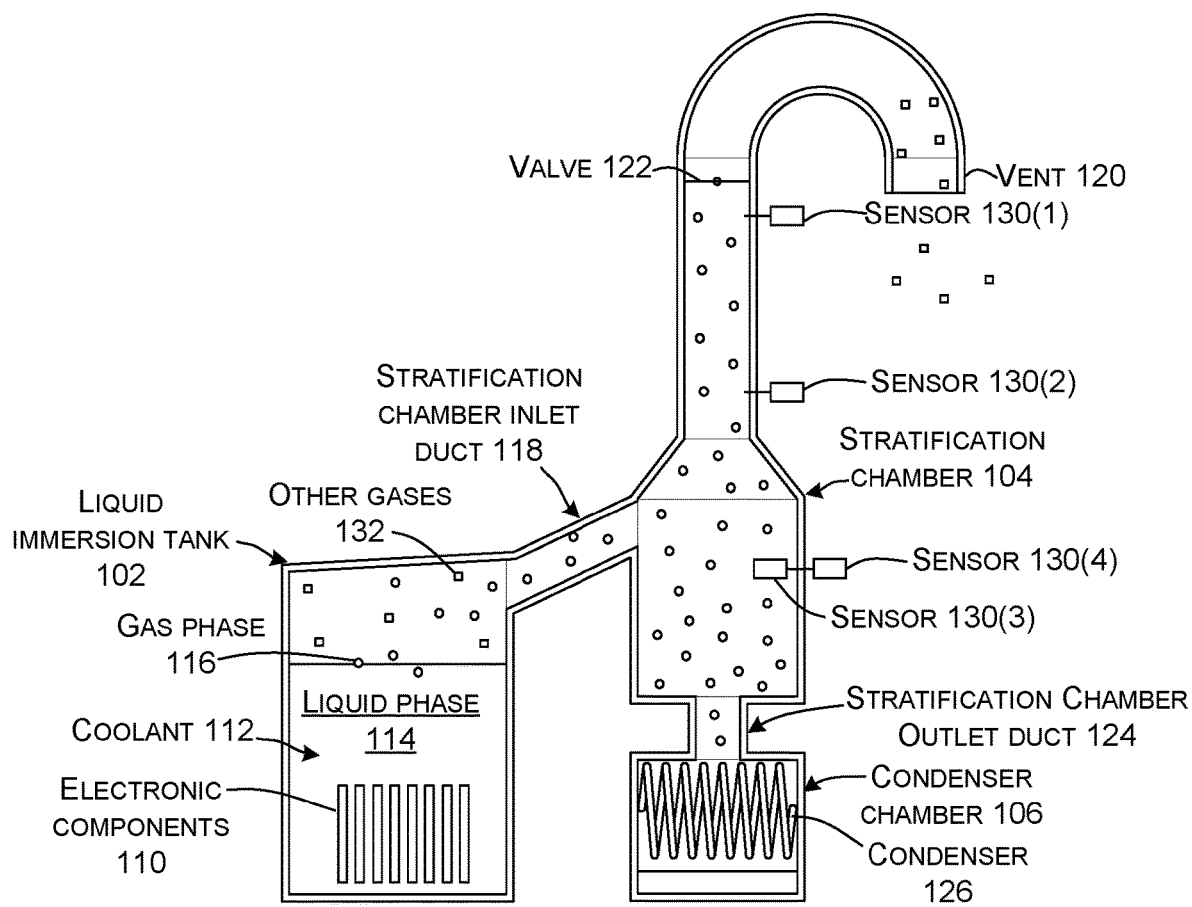

FIG. 1H shows the other gases 132 evacuated and valve 122 closed. At this point, the system 100A can be switched to a normal operating mode. For instance, the amount of coolant 112 boiling can be determined by the load on the electronic components 110. The condenser 126 can be operated to balance the amounts of coolant 112 that are boiling and condensing. The condenser 126 operates at high efficiency because it is free from performance degradation caused by other gases. If any small amount of other gases 132 remain in the system 100A after evacuation, they will tend to remain at the upper regions of the stratification chamber 104 and not interfere with condenser performance. As such, evacuation venting can be performed conservatively (e.g., closing the valve 122 slightly before all of the other gases 132 are evacuated to reduce evacuating any gas phase coolant 116) without sacrificing condenser efficiency. Thus, the present concepts provide technical solutions to the competing problems of preventing other gases 132 from decreasing condenser efficiency and preventing release of coolant 112 from the system 100.

Figure 2A:
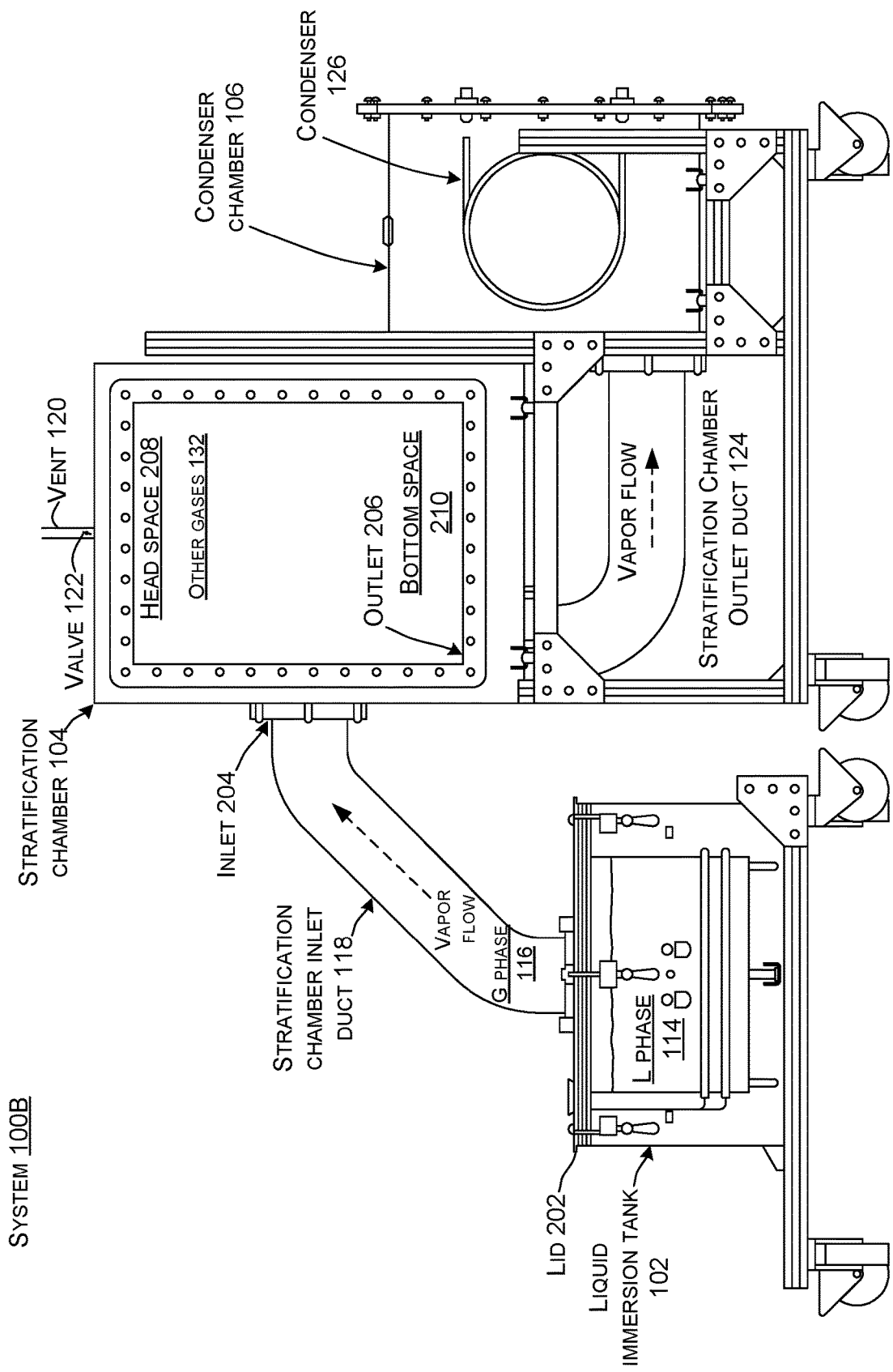
Figure 2C:
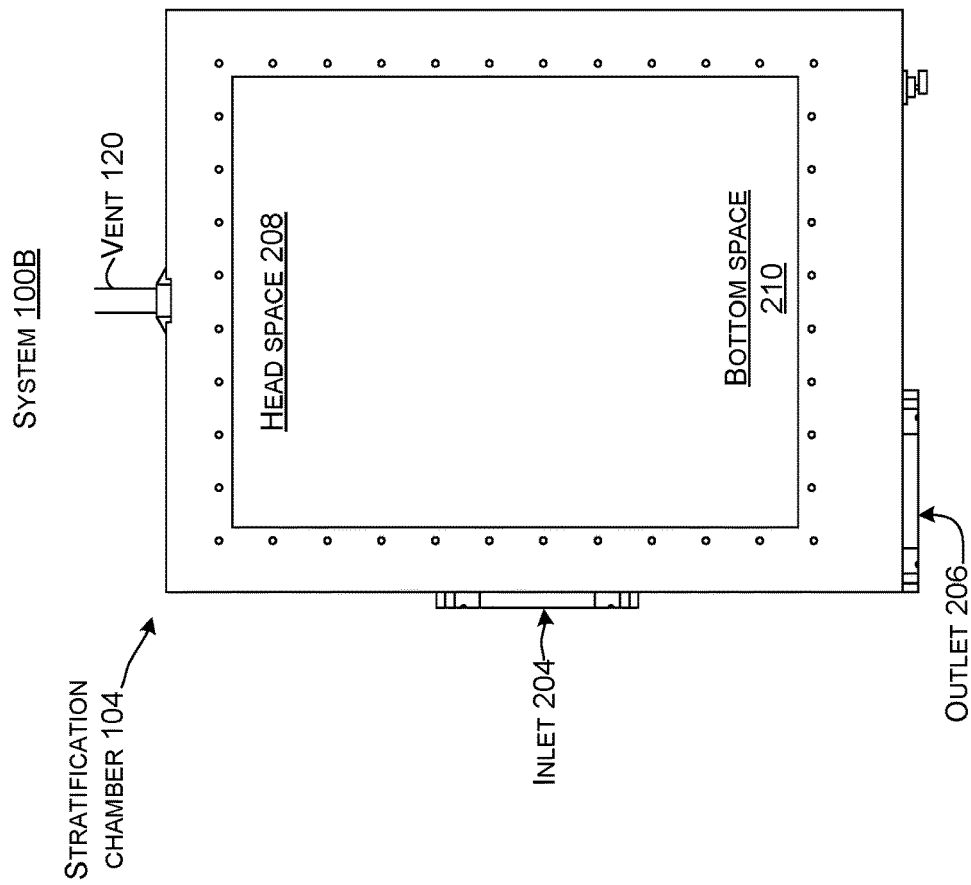
Figure 2B:
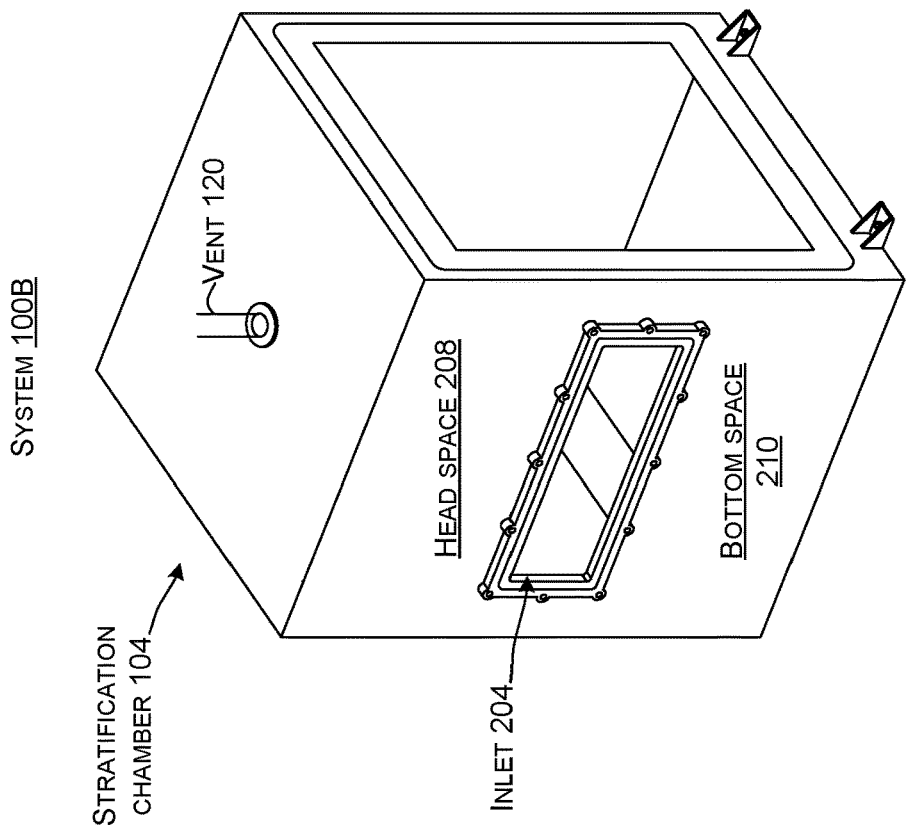
FIGS. 2B and 3B show perspective views of example two-phase coolant systems in accordance with some implementations of the present concepts.

FIGS. 2A-2C collectively show another example system 100B. In this case, the two-phase liquid immersion tank 102, the stratification chamber 104, and the condenser chamber 106 are manifest as independent modules that can be readily replaced. For instance, if the condenser 126 developed a leak, the condenser chamber 106 could readily be swapped out for a new one.

In some implementations, the general thermodynamic operation of system 100B is as follows: the coolant 112 (e.g., working fluid) is boiled in the two-phase liquid immersion tank 102 (e.g., boiler). The boiling coolant 112 creates gas phase coolant 116 (e.g., vapor). Stated another way, the liquid phase coolant 114 phase changes into gas phase coolant 116. The gas phase coolant 116 can carry a significant amount of energy away from the electronic components (shown FIG. 1A) that are in the liquid immersion tank 102. The flow of gas phase coolant 116 then passes via the stratification chamber inlet duct 118 into the stratification chamber 104 (e.g., species separator). If other gases 132, such as air are introduced into the two-phase liquid immersion tank 102, they can be separated from the gas phase coolant 116 in the stratification chamber 104. Separating the other gases 132 from the gas phase coolant 116 increases performance of the condenser 126 by disallowing any air from entering the condenser chamber 106.

A first example of why air would enter the system 100B is during a maintenance event, where a lid 202 on the two-phase liquid immersion tank 102 may be removed while the system is in operation. Another example of how air could enter the system is during system startup, when there is no gas phase coolant 116 present, and the system volume tends to be populated by air.

Recall that the gas phase coolant 116 has a relatively high density compared to other gases 132, such as air that may be present in the system 100B. As mentioned above, the stratification chamber 104 promotes stratification and the relatively dense gas phase coolant 116 sinks to the lower regions of the stratification chamber 104 while the other gases 132 rise to the upper regions of the stratification chamber. From the lower region of the stratification chamber 104, the gas phase coolant 116 travels via the stratification chamber outlet duct 124 to the condenser chamber 106. The condenser chamber 106 can condense the gas phase coolant 116 back into liquid phase coolant 114. The liquid phase coolant 114 in the condenser chamber 106 can be returned back to the two-phase liquid immersion tank 102, such as with a pump and/or via gravity depending on the relative positions of the liquid immersion tank 102 and the condenser chamber 106.

The other gases 132 (e.g., air) can collect at the upper regions of the stratification chamber 104. The vent 120 (e.g., riser pipe) can attach to the top of the stratification chamber 104. The vent 120 can be controlled by the valve 122 to allow extraction of the air after system startup and/or during maintenance.

The stratification chamber 104 can separate air from the gas phase coolant 116 by using the large difference in density between the gas phase coolant 116 and air. The stratification chamber 104 can function at least in part based upon the physical phenomenon that reducing kinetic energy in the incoming flow to the stratification chamber 104, via proper duct sizing, will allow the buoyant forces to dominate, thus naturally allowing the air to rise to the top of the stratification chamber 104 with minimal mixing. To promote stratification based upon density, the stratification chamber inlet duct 118 can terminate at an inlet 204 that can be generally in a mid or intermediate region of the stratification chamber 104. An outlet 206 can be positioned at the bottom of the stratification chamber 104. This configuration can provide head space 208 above the inlet 204 for less dense gases to rise into and bottom space 210 for denser gases to sink into. The stratification chamber configuration, duct sizing, shape, and/or smoothness can contribute to relatively laminar flow of the gases traveling from the liquid immersion tank 102 into the stratification chamber 104. Slow laminar flow can facilitate stratification of the gases in the stratification chamber 104 so that lighter gases are buoyed toward the top and the gas phase coolant 116 settles toward the bottom. Another feature that can contribute to laminar flow and decreased turbulence is described below relative to FIGS. 3A and 3B.

Relative to FIG. 2A, the incoming flow from the stratification chamber inlet duct 118 to the stratification chamber 104 can be relatively slow to allow the buoyant forces to dominate the kinetic energy forces. For instance, in some implementations, the velocity can be less than 0.5 m/s, for example. The location of inlet 204 to the stratification chamber 104 is such that it allows for enough head space 208 to capture a specified volume of air, in mixture with the gas phase coolant 116. There can also be enough bottom space 210 such that outlet 206 is sufficiently far away from the inlet 204, thus weakly decoupling the path of the flow. The further the outlet 206 from the inlet 204, the more the buoyant forces dominate. In this example, the outlet 206 can be stationed at the bottom and on the same wall as the inlet 204.

Figure 3A:
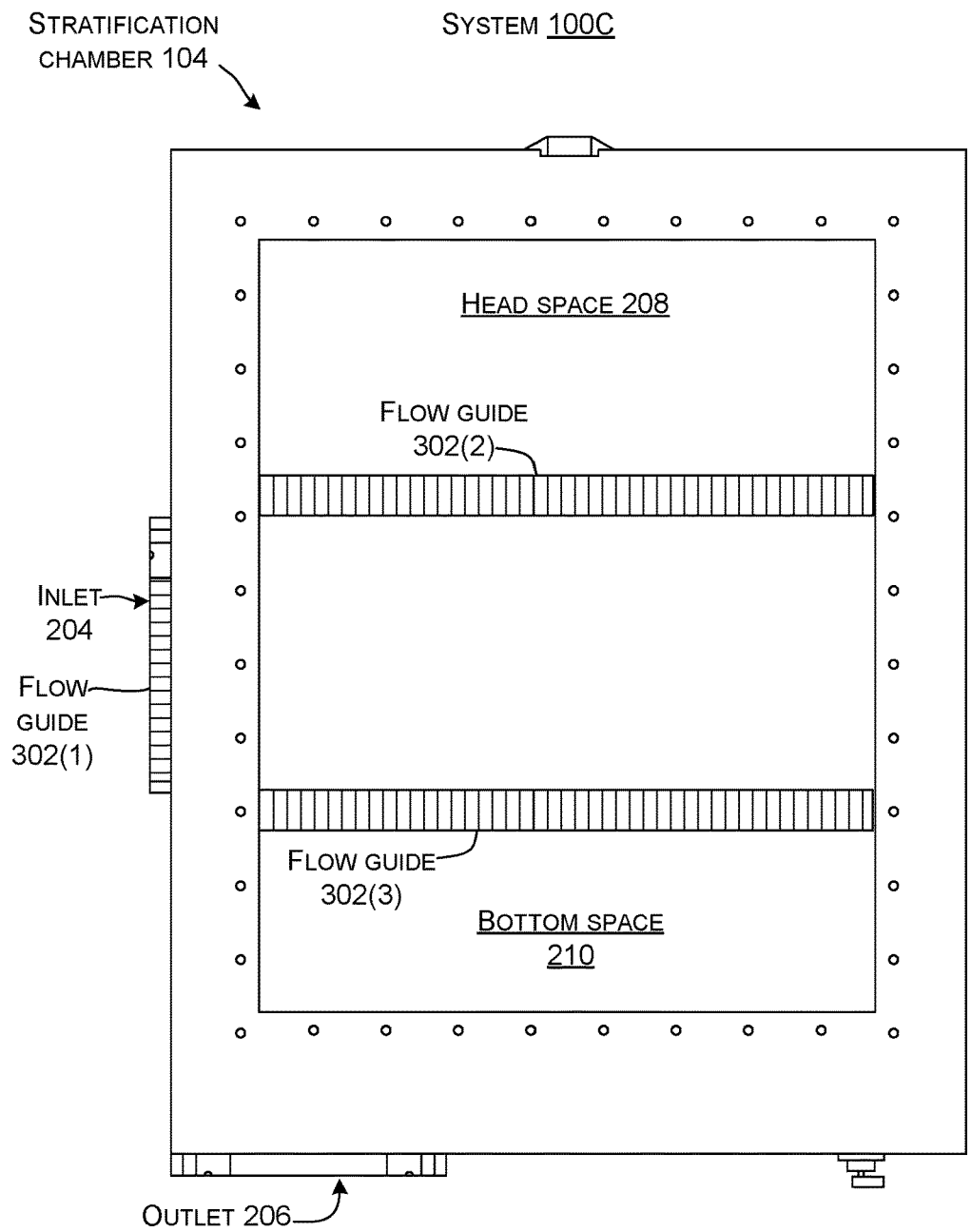
Figure 3B:
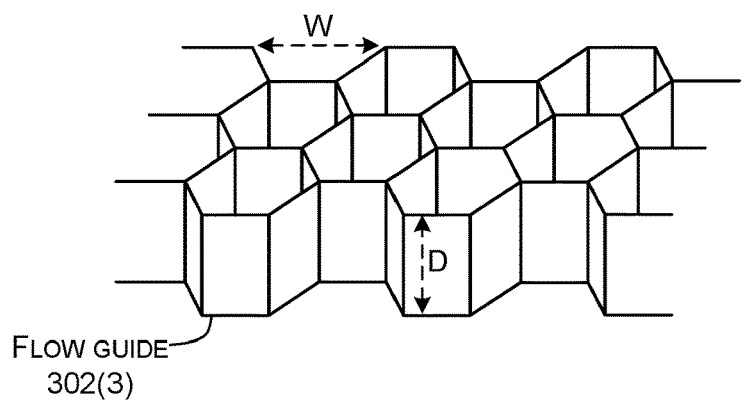

FIGS. 3A and 3B collectively show another example system 100C that includes example stratification chamber 104. In this case, the stratification chamber can include flow guides 302. In this example, three flow guides 302(1)-302(3) are illustrated relative to the stratification chamber 104. In this configuration, flow guide 302(1) is positioned vertically to affect horizontal gas flow through the inlet 204. Flow guide 302(2) is positioned horizontally between the inlet 204 and the head space 208 to affect vertical gas flow up into the head space. Flow guide 302(3) is positioned horizontally between the inlet 204 and the bottom space 210 to affect vertical gas flow down into the bottom space. The flow guides 302 can promote laminar flow and/or reduce turbulence. These conditions allow density differentials to be the dominate factors on the molecules within the stratification chamber 104. Under such conditions, the denser (e.g., heavier) gas phase coolant 116 will settle downward and buoy the lighter air upward against the top of the separation chamber 104.

In the illustrated configuration, the flow guides 302 have a hexagonal shape. Other shapes can be employed. For instance, a square pattern can be employed. In this example, the hexagonal cells can be ¼ to 1 inch wide (W) and can have a depth (D) of ½ to 2 inches, though other dimensions are contemplated.

Figure 4:
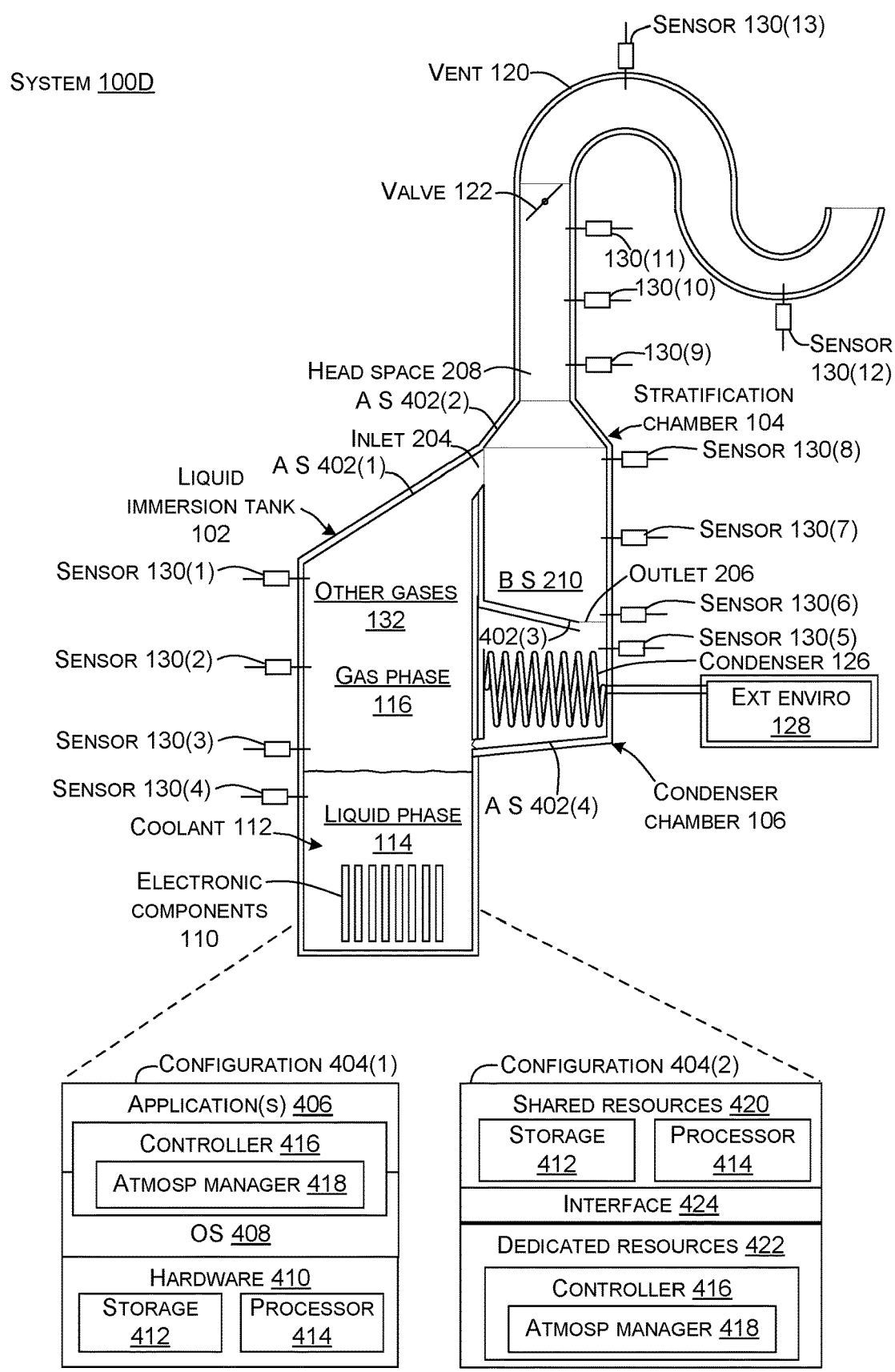

FIG. 4 shows another example system 100D. In this case, the liquid immersion tank 102, stratification chamber 104, and condenser chamber 106 are contained within a single housing. Stated another way, the liquid immersion tank 102, stratification chamber 104, and condenser chamber 106 can be viewed as sub-assemblies of a single self-contained assembly. In this case, the stratification chamber 104 occupies an upper portion of the self-contained assembly and the condenser chamber 106 occupies an intermediate portion of the self-contained assembly. In this example, the condenser chamber 106 and the two-phase liquid immersion tank 102 are horizontally adjacent to one another. In other configurations, the condenser chamber 106 could be above or below the liquid immersion tank 102.

In this implementation, sloped or angled surfaces 402 can be employed to encourage gas and/or liquid movement in desired directions. For instance, angled surface 402(1) promotes relatively light other gases 132 to migrate up and out of the liquid immersion tank 102 into the stratification chamber 104. Angled surfaces 402(2) promote the continued upper movement of these other gases 132. Gas phase coolant 116 that enters the stratification chamber 104 sinks down to and along angled surface 402(3) into the condenser chamber 106 at a location distant from the liquid immersion tank 102. This gas phase coolant 116 can contact the condenser 126 and be cooled until it undergoes a phase change back into the liquid phase coolant 114. This liquid phase coolant 114 can drip from the condenser 126 onto angled surface 402(4) and follow gravity back into the liquid immersion tank 102. This circuitous route can offer continual and extended opportunities for low-density gases and high-density gases to separate from one another. Thus, it is very unlikely that any relatively dense gas phase coolant 116 reaches the upper regions of the stratification chamber 104 proximate to the valve 122. Similarly, it is very unlikely that any relatively low-density other gases 132 reach the condenser chamber 106 where they could interfere with intended condenser function.

System 100D also includes two example resource configurations 404. Briefly, configuration 404(1) represents an operating system (OS) centric configuration. Configuration 404(2) represents a system on a chip (SOC) configuration. Configuration 404(1) is organized into one or more applications 406 and operating system 408 running on hardware 410, such as storage 412 and a processor 414. The hardware 410 can also include previously introduced elements, such as valve 122 and sensors 130, among others.

The system 100D can also include a system controller 416 that can include and/or operate cooperatively with an atmospheric manager 418. The system controller 416 can operate as an application, application part, and/or with the operating system. The system controller 416 can be communicatively coupled to the system elements, such as the electronic components 110, valve 122, sensors 130, condenser 126 (e.g., to a pump driving the condenser), etc. The system controller 416 can default to normal operating conditions. For instance, the system controller 416 can monitor the electrical load on the electronic components 110, calculate the resultant thermal load that will be received by the coolant 112 to produce gas phase coolant 116 from liquid phase coolant 114. The system controller 416 can then control the condenser pump (not specifically shown) to receive the thermal load from the gas phase coolant 116 and remove the thermal load from the system 100D and recycle the coolant (now liquid phase coolant 114). The system controller can continue this normal mode operation unless it receives instructions from the atmospheric manager 418. This aspect is described below after more system details are introduced.

Configuration 404(2) is organized into one or more shared resources 420, such as storage 412 and processor 414, dedicated resources 422, and an interface 424 between them. The system controller 416 can operate with the shared resources 420 and/or the dedicated resources 422.

The system controller 416 and the atmospheric manager 418 can function in a stand-alone manner in controlling operation of a single system 100D. For instance, the system controller 416 may be associated with a single system and other system controllers may be associated with other systems. Alternatively, a single system controller 416 could manage multiple systems.

In some implementations, the system controller 416 and the atmospheric manager 418 can be implemented on computer-readable storage media that can be executed by a processor. As used herein, the term "computer-readable media" can include signals. In contrast, the term "computer-readable storage media" excludes signals. Computer-readable storage media includes "computer-readable storage devices." Examples of computer-readable storage devices include volatile storage media, such as RAM, and non-volatile storage media, such as hard drives, optical discs, and flash memory, among others.

System 100D also includes multiple sensors 130. The sensors can be positioned in any or all of the liquid immersion tank 102, the stratification chamber 104, and/or condenser chamber 106. In this case, there are also sensors 130 in the vent 120. For instance, sensor 130(13) can be positioned in a high region of the vent 120 where relatively low-density gases (e.g., other gases 132) can accumulate and sensor 130(12) can be positioned in a low region of the vent 120 where relatively high-density gases (e.g., gas phase coolant 116) may accumulate. In the illustrated configuration, the stratification chamber 104 is vertically elongated and sensors 130(11), 130(10), 130(9), 130(8), 130(7), and 130(6) are vertically arranged (e.g., vertically distributed) as a sensor array that can sense gas concentrations in the vertically elongated stratification chamber 104.

As illustrated, individual sensors 130 can be configured to sense conditions both inside the system 100D and outside. Alternatively, individual sensors inside the system can be paired with external sensors. The external sensors can sense various ambient conditions, such as pressure, temperature, humidity, etc. The external conditions can provide a baseline for conditions sensed inside the system.

Individual sensors 130 can be configured to sense for the presence of either or both of the gas phase coolant 116 and/or the other gases 132, such as air. Examples of sensor types that can be employed can include speed of sound sensors, resonator sensors, capacitance sensors, and/or non-dispersive infrared (NDIR) sensors, among others. Speed of sound sensors and resonator sensors can measure gas density. As mentioned above, gas phase coolant and air have substantially different densities. As such, density information from the sensor can indicate what gases were sensed and in what relative concentrations. Capacitive sensors can measure dielectric constants. The dielectric constants for air and gas phase coolant are different and sensed values can indicate which gases are present and in what relative concentrations. NDIR sensors can measure Infrared adsorption of specific bandwidths of IR light. The adsorption profile can be indicative of the type of gas sensed and the concentration.

The capacitive sensors can be viewed as capacitive concentration sensors. This sensor type can be used to read absolute concentration at any point or differential concentration (in either a hardware/analog or digital configuration) with the environment outside the system (e.g., outside the stratification chamber 104).

The sensors 130 employed within the system 100D can be configured for the internal conditions. For instance, the sensors 130 can be fluid-phase tolerant for the coolant 112. Alternatively, to prevent condensation, the sensor (or at least a sensor probe) can be heated to a temperature at or above the condensation temperature of the coolant 112 (e.g., of the gas phase coolant 116). Stated another way, the concentration sensor can be heated to eliminate condensation on the probe which would tend to invalidate the concentration reading of the sensor (false readings due to deviation from calibration). In some configurations, the sensor probe may contain a heating element to heat the probe. This sensor heating can be low-level heating so that the temperature is not high enough to breakdown vapor. This can be important given the system is a closed loop system and the chemicals released by ignited fluoro-based coolant fluids can be harmful to people and equipment.

The exterior or external "reference" sensors can provide external conditions that can be used to calibrate to atmospheric conditions similar to how pressure sensors have differential ends.

The atmospheric manager 418 can utilize this sensor data (e.g., sensed values) to control system operation. For instance, the atmospheric manager 418 may allow the system controller 416 to operate the system under normal conditions (e.g., normal stage or normal phase) if no other gases 132 are detected with the sensor array (e.g., only gas phase coolant 116 is detected).

In some configurations a value may be defined for individual sensors 130. For instance, the defined value may be a concentration, such as parts per million (ppm) or percent. For example, the defined value for sensor 130(11) may be 50% other gases (e.g., 50% other gases 132 and 50% gas phase coolant 116) and the defined value for sensor 130(10) may be 10% other gases and 90% gas phase coolant 116. The defined value for sensor 130(9) may be 1% other gases and 99% gas phase coolant 116.

If sensed values from sensor 130(11), sensor 130(10), or sensor 130(9) exceed their defined values, the atmospheric manager 418 may cause the system controller 416 to switch the system from normal operation to a purge operation (e.g., purge stage or purge phase). The purge operation can evacuate the other gases by opening valve 122. This aspect is described in detail above relative to FIGS. 1A-1H. Thus, the system 100D can tolerate some other gases 132 because of the geometric configuration of the stratification chamber 104. For instance, the vertically elongate configuration of the stratification chamber 104 and/or the location of the inlet 204 and outlet 206 and associated head space 208 and bottom space 210 can contribute to isolating the other gases 132. Isolating the other gases 132 in the upper regions of the stratification chamber 104 can prevent the other gases from interfering with condenser function.

A detailed example of how the system controller 416 and the atmospheric manager 418 can cooperatively manage normal operation or normal stage and purge stage is described below. The example is explained starting with the purge stage because the purge stage would likely occur after system start up, but the order of the explanation is provided with recognition that the stages may alternate with one another.

The purge stage can be performed automatically upon system start-up and/or based upon sensor data. The concentration sensor(s) can measure percentages of gas phase coolant 116 (e.g., coolant vapor) versus all the other gases 132 (e.g., non-condensable(s)). The atmospheric manager 418 can compare the measured percentages to a predefined threshold. If the sensed ratio is below the threshold (too many other gases 132 relative to the gas phase coolant 116) then the atmospheric manager 418 can take one or more actions, such as instructing the system controller 416 to begin the purge phase. Another one of the actions can be to reduce coolant flow through the condenser 126 (within a non-performance/IT impacting dead band) for a time interval. Due to the reduced condenser coolant flowrate, a slight amount of additional gas phase coolant 116 (e.g., coolant vapor) is produced (within a predefined time band). Shortly thereafter, the atmospheric manager 418 can open the valve 122. The pressure from the slight amount of additional gas phase coolant 116 can facilitate the natural tendency of the less dense other gases 132 to rise out of the stratification chamber into the vent 120.

After a brief evacuation period, the atmospheric manager 418 can close the valve 122. The evacuation period can be a predefined duration. Alternatively, the evacuation period can be stopped based on increasing concentration densities at individual sensors, such as sensor 130(11). Stated another way, the atmospheric manager 418 can close the valve 122 when the sensed concentrations return to expected levels (e.g., high ratio of gas phase coolant 116 to other gases 132).

Further, the present implementations can provide a learning or feedback model. As noted above, it is desirable to avoid expelling gas phase coolant. Sensor 130(12) is positioned at a low point in the vent where expelled gas phase coolant would tend to accumulate. If this occurs (e.g., sensor 130(12) detects gas phase coolant 116), then various parameters associated with the purging phase can be changed during the next purge phase. For instance, the predefined duration that the valve 122 is opened can be changed (e.g., shortened). Similarly, the extent that the valve is opened may be changed (e.g., a smaller evacuation path may be created). Alternatively, the pressure in the system could be lowered slightly during the next purge phase. Recall that the pressure can be controlled by how the condenser 126 is operated directly preceding valve opening. For instance, if the pressure was raised to 105% of ambient air pressure before opening the valve 122, during the next purge cycle the pressure may be raised only to 103%, for example.

Again, during that next purge phase, sensor 130(12) can provide information about whether gas phase coolant 116 was expelled. This refinement or learning can continue to improve results. Further, because of the vertically elongated configuration of the stratification chamber 104 that tends to isolate other gases 132 so that they do not interfere with condenser function, the purging can be performed conservatively. Stated another way, the purging can be performed in a manner to avoid expelling gas phase coolant 116 rather than to expel all of the other gases 132. This conservative approach can avoid the negative ramifications of expelling the gas phase coolant 116 without reducing condenser efficiency because small amounts of other gases isolated in the upper region of the stratification chamber will not diminish system performance.

After the non-condensable other gases 132 are expelled out of stratification chamber 104, operation can return to normal. In normal operation, the system controller 416 can return condenser operation to normal (e.g., fully compensating rate balanced with the thermal load being carried by the gas phase coolant 116). The electronic components 110 can be operated based upon the data load or processing load with the heat being locally removed by the coolant 112 and ultimately being externalized from the system by the condenser 126 (e.g., to the external environment 128). During the normal phase, the atmospheric manager 418 can operate the system (e.g., via controlling the condenser) at 100% of the ambient pressure or very slightly under. This equal or slight negative pressure can reduce slow outward leaking of coolant from the system 100D. If air slowly enters the system, atmospheric manager 418 can, from time to time, return to the purge phase to expel the air in a controlled manner without expelling coolant 112. The pressure sensors can be monitored by the atmospheric manager 418, but may not be used to actively control the amount of coolant flow to the condenser. The atmospheric manager 418 can also provide a safety role so that if the internal pressure rises above or drops below predefined safety levels, the atmospheric manager 418 can initiate emergency protocols, such as eliminating the load from the electronic components 110 and thereby decreasing pressure via eliminating coolant boiling.

Figure 5:
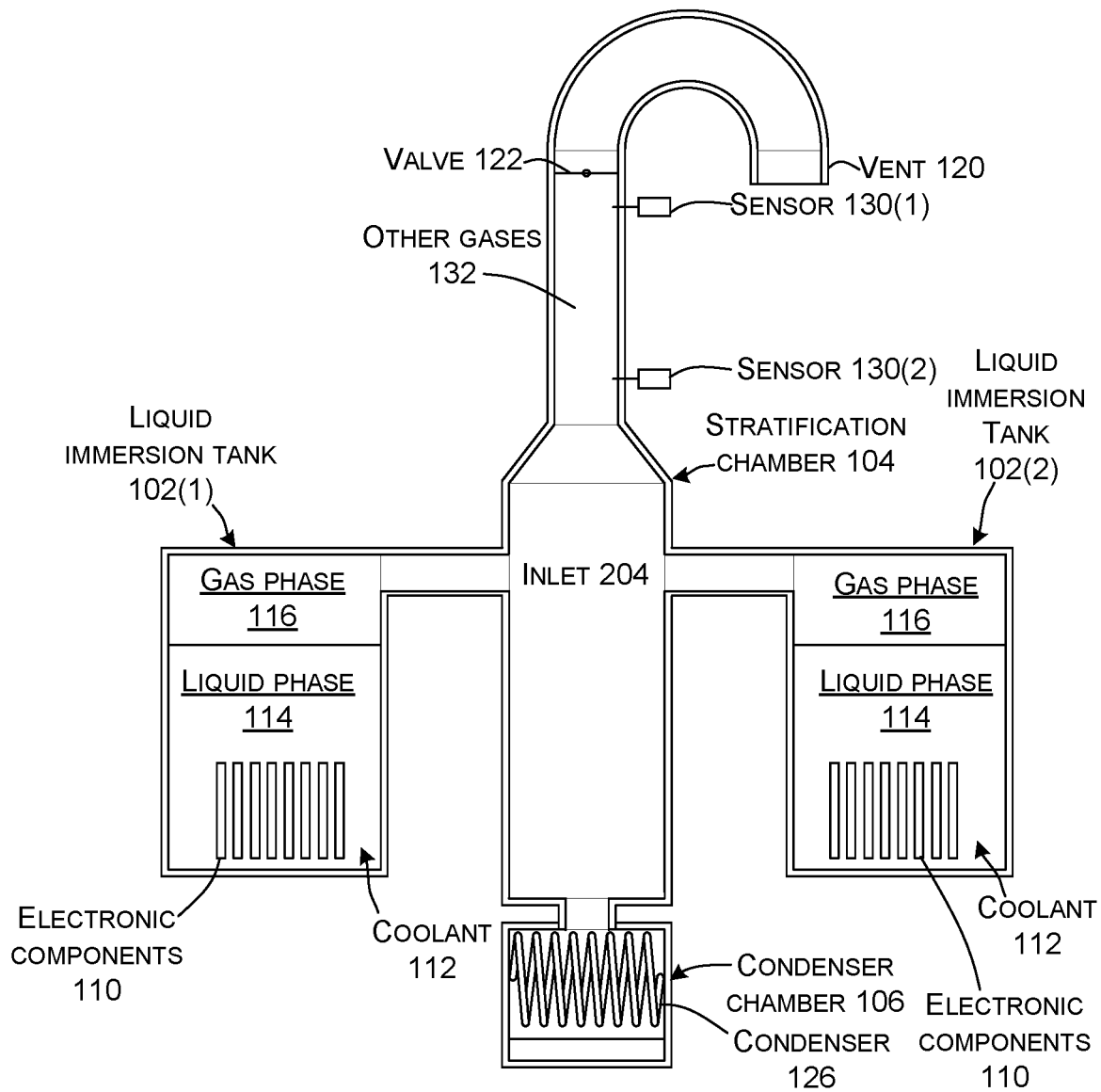

FIG. 5 shows another example system 100E. In this case, a single stratification chamber 104 and a single condenser chamber 106 can handle multiple two-phase liquid immersion tanks 102. In this case, two two-phase immersion tanks 102(1) and 102(2) are coupled to the stratification chamber 104. Additional two-phase immersion tanks 102 can be coupled to the stratification chamber 104 in a similar manner.

In this example, the inlet 204 to the stratification chamber 104 is level with the top of the two-phase immersion tanks 102. In this configuration, the relatively dense gas phase coolant 116 is not forced to rise up an incline, but rather can flow laterally into the stratification chamber 104. Stratification of different density gases can occur within the stratification chamber 104. In still other implementations, the inlet could be lower than the two-phase liquid immersion tanks 102 to allow the gas phase coolant 116 to flow down into the stratification chamber 104.

In still another implementation, the liquid immersion tank 102 could have an upper duct that is coupled to a relatively high point in the liquid immersion tank and that slants upwardly to the stratification chamber 104. A lower duct could be positioned relatively low in the liquid immersion tank (but above the liquid) and slant downwardly into the stratification chamber. The upper duct would tend to transport less dense gases (e.g., air) to a higher portion of the stratification chamber 104 and the lower duct would tend to transport the denser gases (e.g., gas phase coolant) to lower regions of the stratification chamber. This configuration could lead to even less gas mixing and promote stratification in the stratification chamber.

Figure 6:
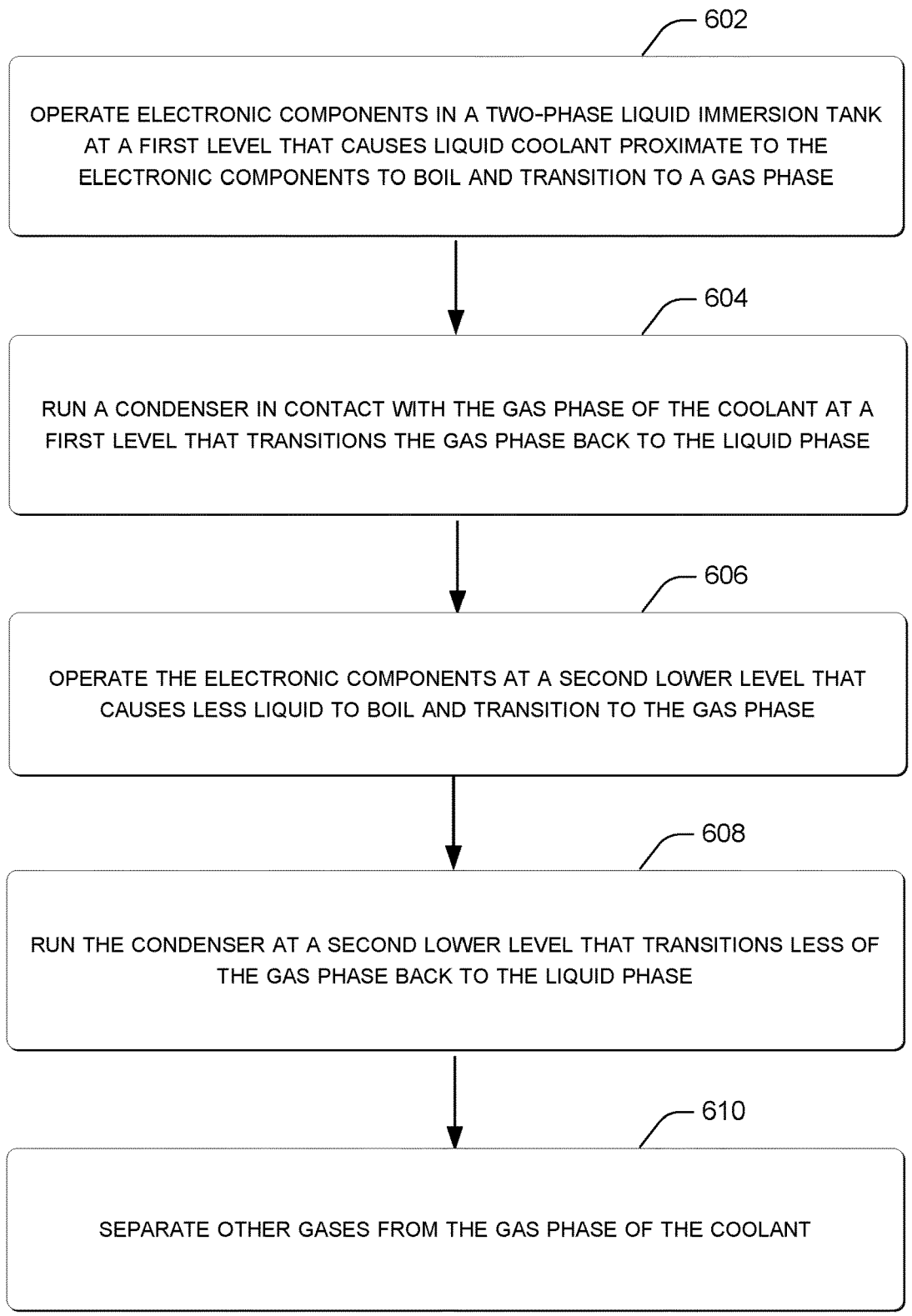
FIG. 6 shows a flowchart of an example two-phase coolant management method that can implement some of the present concepts in accordance with some implementations.

FIG. 6 shows an example flowchart of a two-phase liquid cooling technique or method 600.

At 602 the method can operate electronic components in a two-phase liquid immersion tank at a first level that causes liquid coolant proximate to the electronic components to boil and transition to a gas phase.

At 604 the method can run a condenser in contact with the gas phase of the coolant at a first level that transitions the gas phase back to the liquid phase.

At 606 the method can operate the electronic components at a second lower level that causes less liquid to boil and transition to the gas phase.

At 608 the method can run the condenser at a second lower level that transitions less of the gas phase back to the liquid phase.

At 610 the method can separate other gases from the gas phase of the coolant. For instance, the other gases may be less dense than the gas phase coolant and may separate (e.g., stratify) based upon density. The other gases can then be readily removed from the system, such as by evacuation with a valve in a region where the less dense gases gather.

The described methods can be performed by the systems and/or elements described above and/or below, and/or by other devices and/or systems.

The order in which the methods are described is not intended to be construed as a limitation, and any number of the described acts can be combined in any order to implement the method, or an alternate method. Furthermore, the method can be implemented in any suitable hardware, software, firmware, or combination thereof, such that a device can implement the method. In one case, the method is stored on one or more computer-readable storage medium/media as a set of instructions (e.g., computer-readable instructions or computer-executable instructions) such that execution by a processor causes the processor to perform the method.

Various examples are described above. Additional examples are described below. One example includes a system comprising a two-phase liquid immersion tank containing heat generating components and a liquid phase of a coolant having a boiling point within an operating temperature range of the heat generating components, a stratification chamber fluidly coupled to the liquid immersion tank and configured to at least partially vertically separate a gas phase of the coolant from other gases that are relatively less dense than the gas phase of the coolant and to allow removal of the separated other gases while retaining the gas phase of the coolant, and a condenser chamber fluidly coupled to a lower region of the stratification chamber and configured to receive the gas phase of the coolant and cause the gas phase of the coolant to change phase back into the liquid phase of the coolant.

Another example can include any of the above and/or below examples where the stratification chamber is above the liquid immersion tank or wherein the stratification chamber is below the liquid immersion tank.

Another example can include any of the above and/or below examples where sensors are positioned in the stratification chamber and configured to distinguish the other gases from the gas phase of the coolant.

Another example can include any of the above and/or below examples where the sensors comprise speed of sound sensors, resonator sensors, capacitance sensors, or non-dispersive infrared sensors.

Another example can include any of the above and/or below examples where at least some of the sensors include a heating element.

Another example can include any of the above and/or below examples where the heating element is configured to heat the sensor at or above a condensation temperature of the gas phase of the coolant.

Another example can include any of the above and/or below examples where the sensors are vertically distributed in the stratification chamber.

Another example can include any of the above and/or below examples where a valve is positioned in the stratification chamber above the sensors.

Another example can include any of the above and/or below examples where data from the sensors is utilized to open the valve when an uppermost sensor indicates a higher relative concentration of the other gases to the gas phase of the coolant than lower sensors.

Another example can include any of the above and/or below examples where the stratification chamber comprises an upper portion of the liquid immersion tank and the condenser chamber comprises an intermediate portion of the liquid immersion tank.

Another example can include any of the above and/or below examples where the stratification chamber is fluidly coupled to the liquid immersion tank by a stratification chamber inlet duct and the stratification chamber is fluidly coupled to the condenser chamber by a stratification chamber outlet duct.

Another example includes a system comprising a two-phase liquid immersion tank containing heat generating components positioned in a liquid phase of a coolant, a vertically elongated stratification chamber fluidly coupled to the liquid immersion tank and configured to at least partially separate a gas phase of the coolant from other gases that rise to upper regions of the vertically elongated stratification chamber, and, a condenser chamber fluidly coupled to a bottom of the stratification chamber and configured to receive the gas phase of the coolant and cause the gas phase of the coolant to change phase back into the liquid phase of the coolant.

Another example includes a device implemented method, comprising operating electronic components in a two-phase liquid immersion tank at a first level that causes liquid coolant proximate to the electronic components to boil and transition to a gas phase, running a condenser in contact with the gas phase of the coolant at a first level that transitions the gas phase back to the liquid phase, operating the electronic components at a second lower level that causes less liquid to boil and transition to the gas phase, running the condenser at a second lower level that transitions less of the gas phase back to the liquid phase, and separating other gases from the gas phase of the coolant.

Another example can include any of the above and/or below examples where the operating at the second lower level and the running at the second lower level, increases pressure of the gas phase in a chamber containing the gas phase and the other gases.

Another example can include any of the above and/or below examples where the operating at the second lower level and the running at the second lower level, decreases movement of the gas phase and the other gases in the chamber.

Another example can include any of the above and/or below examples and further includes sensing for a presence of the other gases in the chamber.

Another example can include any of the above and/or below examples where the separating comprises separating when sensed values of regions of the chamber reach a defined value.

Another example can include any of the above and/or below examples where the separating comprises opening a valve in the chamber.

Another example can include any of the above and/or below examples where the valve is positioned in the chamber based upon relative densities of the gas phase and the other gases.

Another example can include any of the above and/or below examples further includes returning to the operating at the first level and running at the first level when the sensed values fall below the defined values.

Another example can include any of the above and/or below examples where the separating other gases from the gas phase of the coolant comprises introducing the gases to a mid-region of a vertically elongated stratification chamber and allowing the other gases to rise to upper regions of the vertically elongated stratification chamber and allowing the gas phase of the coolant to sink in the vertically elongated stratification chamber.

Another example can include any of the above and/or below examples further includes opening a valve at the top of the vertically elongated stratification chamber to evacuate the other gases to evacuate from the upper regions of the vertically elongated stratification chamber.

CONCLUSION

Although the subject matter relating to two-phase coolant management has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A system, comprising: a two-phase liquid immersion tank containing heat generating components and a liquid phase of a coolant having a boiling point within an operating temperature range of the heat generating components; a vertically elongated stratification chamber fluidly coupled to the liquid immersion tank and configured to at least partially vertically separate a gas phase of the coolant from other gases that are relatively less dense than the gas phase of the coolant and to allow removal of the other gases while retaining the gas phase of the coolant; and, upper and lower sensors vertically distributed in the vertically elongated stratification chamber and configured to sense concentrations of the gas phase of the coolant and/or concentrations of the other gases; a valve positioned towards a top of the vertically elongated stratification chamber and configured to be controlled based upon the concentrations of the gas phase of the coolant and/or the concentrations of the other gases sensed by the upper and lower sensors; and, a condenser chamber fluidly coupled to a lower region of the stratification chamber and configured to receive the gas phase of the coolant and cause the gas phase of the coolant to change phase back into the liquid phase of the coolant.

2. The system of claim 1, wherein the stratification chamber is above the liquid immersion tank or wherein the stratification chamber is below the liquid immersion tank.

3. The system of claim 1, wherein the vertically elongated stratification chamber comprises sloped or angled surfaces leading to a relatively narrow upper region.

4. The system of claim 1, wherein the upper and lower sensors comprise speed of sound sensors, resonator sensors, capacitance sensors, or non-dispersive infrared sensors.

5. The system of claim 4, wherein at least one of the upper and lower sensors includes a heating element.

6. The system of claim 5, wherein the heating element is configured to heat the sensor at or above a condensation temperature of the gas phase of the coolant.

7. The system of claim 1, further comprising a flow guide positioned relative to the vertically elongated stratification chamber and configured to promote laminar flow of gases.

8. The system of claim 7, wherein the flow guide comprises an array of parallel cells through which the gases flow.

9. The system of claim 1, wherein data from the upper and lower sensors is utilized to open the valve when the uppermost sensor indicates a higher relative concentration of the other gases to the gas phase of the coolant than the lower sensors.

10. The system of claim 1, wherein the stratification chamber comprises an upper portion of the liquid immersion tank and the condenser chamber comprises an intermediate portion of the liquid immersion tank.

11. The system of claim 1, wherein the stratification chamber is fluidly coupled to the liquid immersion tank by a stratification chamber inlet duct and the stratification chamber is fluidly coupled to the condenser chamber by a stratification chamber outlet duct.

12. A system, comprising:
a two-phase liquid immersion tank containing heat generating components positioned in a liquid phase of a coolant;

a vertically elongated stratification chamber comprising sloped or angled surfaces leading to a relatively narrow upper region, the vertically elongated stratification chamber fluidly coupled to the liquid immersion tank and configured to at least partially separate a gas phase of the coolant from other gases that rise to the relatively narrow upper region of the vertically elongated stratification chamber; and, a condenser chamber fluidly coupled to a bottom of the stratification chamber and configured to receive the gas phase of the coolant and cause the gas phase of the coolant to change phase back into the liquid phase of the coolant.

13. A device implemented method, comprising: operating electronic components in a two-phase liquid immersion tank at a first level that causes liquid coolant proximate to the electronic components to boil and transition to a gas phase; running a condenser in contact with the gas phase of the coolant at a first level that transitions the gas phase back to the liquid phase; operating the electronic components at a second lower level that causes less liquid coolant to boil and transition to the gas phase; running the condenser at a second lower level that transitions less of the gas phase back to the liquid phase; and, separating other gases from the gas phase of the coolant; in a vertically elongated stratification chamber that is fluidly positioned between the two-phase liquid immersion tank and the condenser, the vertically elongated stratification chamber comprising sloped or angled surfaces leading to a relatively narrow upper region.

14. The method of claim 13, wherein the operating at the second lower level and the running at the second lower level, increases pressure of the gas phase in the vertically elongated stratification chamber containing the gas phase and the other gases.

15. The method of claim 14, wherein the operating at the second lower level and the running at the second lower level, decreases movement of the gas phase and the other gases in the vertically elongated stratification chamber.

16. The method of claim 15, further comprising sensing for a presence of the other gases in the vertically elongated stratification chamber.

17. The method of claim 16, wherein the separating comprises separating when sensed values of regions of the vertically elongated stratification chamber reach a defined value.

18. The method of claim 17, wherein the separating comprises opening a valve in the vertically elongated stratification chamber.

19. The method of claim 18, wherein the valve is positioned in the vertically elongated stratification chamber based upon relative densities of the gas phase and the other gases.

20. The method of claim 18, further comprising returning to the operating at the first level and running at the first level when the sensed values fall below the defined values.

* * * * *